United States Patent [19]
Seibert et al.

[11] Patent Number: 5,031,071
[45] Date of Patent: Jul. 9, 1991

[54] HEAT SPREADING DEVICE FOR COMPONENT LEADS

[75] Inventors: James D. Seibert, Watauga; Ravinder N. Bhatla, Hurst, both of Tex.

[73] Assignee: Motorola, Inc., Schaumburg, Ill.

[21] Appl. No.: 516,634

[22] Filed: Apr. 30, 1990

[51] Int. Cl.⁵ .............................................. H05K 7/20
[52] U.S. Cl. ................................... 361/386; 361/388; 361/405; 361/406
[58] Field of Search .......................... 361/386–389, 361/400, 405, 406; 174/16.3; 357/81; 165/80.3

[56] References Cited

U.S. PATENT DOCUMENTS

| | | | |
|---|---|---|---|
| 4,254,447 | 3/1981 | Griffis | 361/389 |
| 4,495,378 | 1/1985 | Dotzer et al. | 361/386 |
| 4,552,206 | 1/1983 | Johnson et al. | 165/80.3 |
| 4,682,269 | 7/1987 | Pitasi | 361/388 |
| 4,922,378 | 5/1990 | Malhi et al. | 361/387 |
| 4,945,451 | 7/1990 | Gohl et al. | 361/388 |

FOREIGN PATENT DOCUMENTS 3305167  8/1984  Fed. Rep. of Germany ...... 361/387

Primary Examiner—Gregory D. Thompson
Attorney, Agent, or Firm—Pablo Meles

[57] ABSTRACT

A circuit assembly (5) and heat spreader (12) combination comprises a first substrate (10), a power device (18) having at least one lead (22) mounted on the first substrate (10), and a second electrically insulative, thermally conductive substrate (12) mounted perpendicularly to the first substrate (10). The second substrate (12) has at least one solder receptive area (14) for solder interconnection (16) between at least one lead (22) of the power device (18) and the second substrate (12).

11 Claims, 1 Drawing Sheet

HEAT SPREADING DEVICE FOR COMPONENT LEADS

TECHNICAL FIELD

This invention relates generally to the field of heat spreading devices for component leads, and more specifically to a device for spreading heat from a power device.

BACKGROUND

Power transistors and other power devices typically generate sufficient heat to undermine the integrity of their solder connections due to the different thermal coefficients of expansion between that of their leads and those of the various materials used on a printed circuit board assembly. Conventional heat sinking arrangements using blocks of metal placed below the power devices or below the printed circuit boards beneath the power devices unduly increases the weight, size, and cost of the printed circuit board assembly having power devices, and are mainly used to remove heat from the internal source (i.e., a die of a transistor), without regard for the temperature of the device leads. The proposed invention removes this heat which would otherwise tend to degrade the solder connection. In addition, as the quality of the power device lead solder degrades, the resistance to current flow increases. This added resistance causes heat generation within the joint and a run-away failure of the solder joint can occur. Because of its proximity to this heat source, the present invention is superior to conventional heat sinking methods.

SUMMARY OF THE INVENTION

Accordingly, it is an object of the present invention to provide a heat spreader device for attachment to at least one lead of a power device which has an electrically insulative and thermally conductive substrate. The substrate at least has one solder receptive area on the substrate for solder interconnection between the substrate and the lead of the power device.

DETAILED DESCRIPTION OF THE PREFERRED EMBODIMENT

Figure 1:
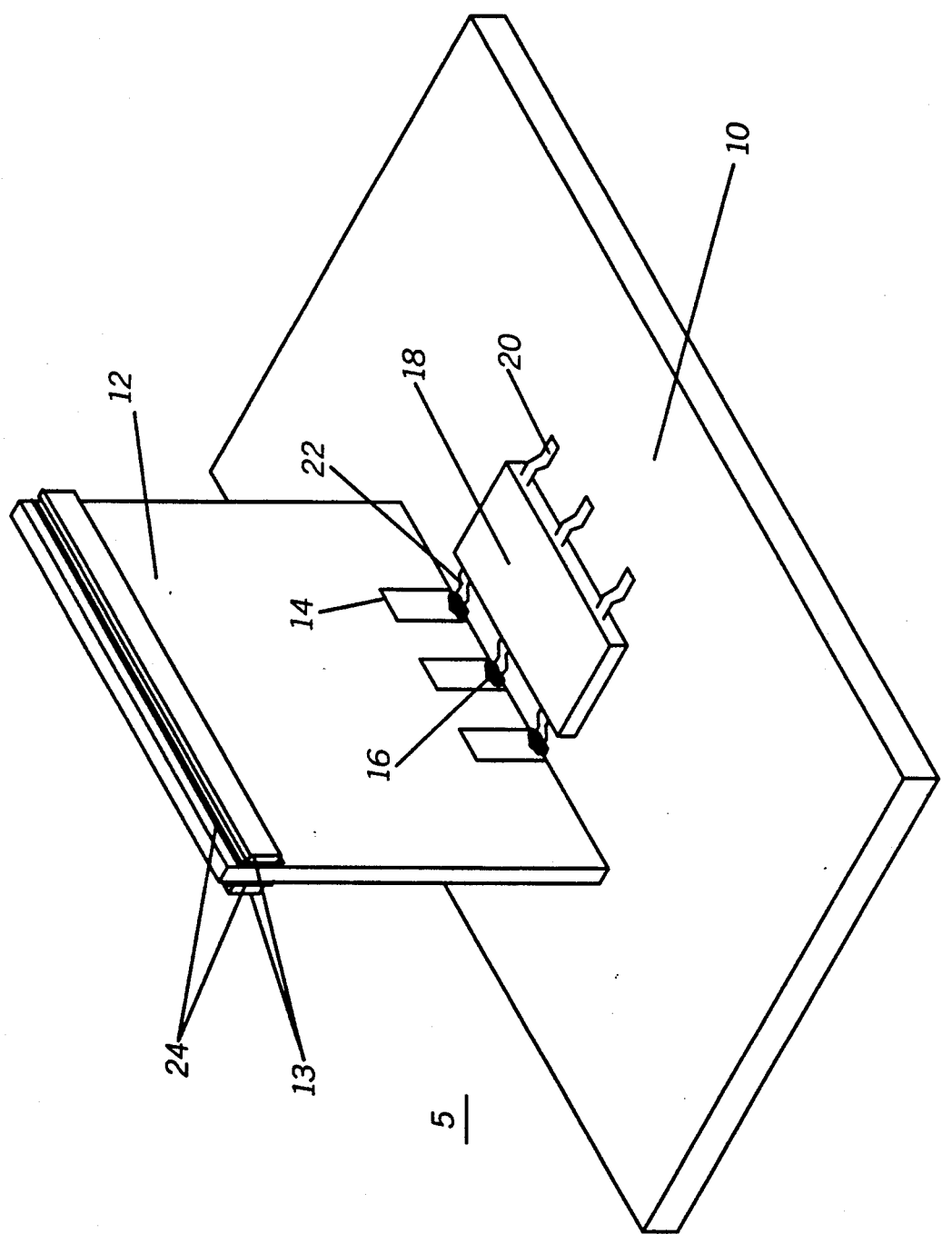
FIG. 1 is a perspective view of the heat spreader device in accordance with the present invention.

Referring to FIG. 1, there is shown a circuit assembly 5 having a power device 18 such as a power transistor, a resistor, an SCR, or a power diode mounted on a substrate 10. The present invention is ideal for use in sensitive electronic devices such as radio communication products that may require heat sinking and dissipation without any appreciable degradation in the performance of the electronic device.

The power device 18 shown in FIG. 1 preferably has leads 20 and 22 that couple the power device 18 to other circuits (not shown) on the substrate 10. Another substrate 12, preferably being electrically insulating and thermally conductive, has a number of solder receptive area 14 that are generally metallized with silver, copper, tin or gold. The substrate 12 is preferably comprised of alumina, beryllium oxide, or aluminum nitride. These materials provide excellent thermal conductivity as well as heat capacity.

The substrate 12 is preferably attached to some of the leads (22) of the power device 18 by soldering the leads (22) to the solder receptive areas 14 on the substrate 12. The substrate 12 is preferably in a vertical position perpendicular to the power device 18. This configuration allows for greater heat dissipation than conventional heat sink configurations. The substrate 12 should spread and dissipate heat away from the power device 18 and other componentry (not shown) that may be on the substrate 10. Furthermore, the substrate 12 should evenly distribute the heat among the leads (22) that the substrate 12 is coupled to. Optionally, the substrate 12 can include another solder receptive area (24) to increase the substrate's heat sinking capacity by coupling additional highly thermally conductive material (13) to the area (24) The conductive material 13 can optimally comprise of copper rods soldered to the top portion of the substrate 12, preferably to the solder receptive area 24. The copper rods serve as an additional thermal reservoir. Finally, the present invention as described does not cause any appreciable degradation to the electronic performance of the circuit board assembly 5.

What is claimed is:

1. A circuit assembly and heat spreader combination, comprising:
   a first substrate;
   a power device having at least one lead mounted on said first substrate; and
   a second electrically insulative, thermally conductive substrate mounted perpendicularly to said first substrate, said second substrate having at least one solder receptive area for solder interconnection of said at least one lead of said power device and said second substrate.

2. The circuit assembly and heat spreader combination of claim 1, wherein said second substrate further comprises a thermally conductive material thermally attached to the upper portion of said second substrate for further increasing the heat sinking capacity of the second substrate.

3. The circuit assembly and heat spreader combination of claim 1, wherein said power device comprises a power transistor.

4. The circuit assembly and heat spreader combination of claim 1, wherein said power device comprises a thyristor.

5. The circuit assembly and heat spreader combination of claim 1, wherein said power device comprises a resistor.

6. The circuit assembly and heat spreader combination of claim 1, wherein said power device comprises a diode.

7. The circuit assembly and heat spreader combination of claim 2, wherein the thermally conductive material thermally attached to the upper portion of said second substrate comprises copper rod.

8. The circuit assembly and heat spreader combination of claim 1, wherein the second substrate comprises alumina.

9. The circuit assembly and heat spreader combination of claim 1, wherein the second substrate comprises beryllium oxide.

10. The circuit assembly and heat spreader combination of claim 1, wherein the second substrate comprises aluminum nitride.

11. The circuit assembly and heat spreader combination of claim 1, wherein the solder receptive area comprises silver.

* * * * *